US 6,721,372 B1

(12) United States Patent
Banik et al.

(10) Patent No.: US 6,721,372 B1
(45) Date of Patent: Apr. 13, 2004

(54) INTELLIGENT SOFTWARE CONTROLLED CORRECTION OF FREQUENCY TRACKING FOR A LOCAL OSCILLATOR OF A RECEIVER OF A WIRELESS DEVICE

(75) Inventors: Somnath Banik, Allentown, PA (US); Jeffrey P. Grundvig, Macungie, PA (US); Richard L. McDowell, Chalfont, PA (US); Carl R. Stevenson, Macungie, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/527,289

(22) Filed: Mar. 17, 2000

(51) Int. Cl.$^7$ ................................................ H04L 27/06
(52) U.S. Cl. ........................ 375/344; 375/362; 375/364; 455/265
(58) Field of Search .......................... 375/146, 147, 375/145, 149, 148, 285, 295, 296, 316, 329, 327, 340, 364, 342, 344, 357, 362, 354, 355; 370/350, 503, 509, 510, 513, 514, 516, 517; 455/192.1, 164.1, 192.2, 71, 182.1, 182.2, 208, 214, 222, 255, 502, 462, 265

(56) References Cited

U.S. PATENT DOCUMENTS

| 4,229,825 A | 10/1980 | Guidoux |
| 4,893,317 A | 1/1990 | Critchlow et al. |
| 5,168,507 A | 12/1992 | Critchlow et al. |

(List continued on next page.)

FOREIGN PATENT DOCUMENTS

| EP | 97304717.8 | 6/1997 |
| EP | 97304718.6 | 6/1997 |
| GB | 2 011 764 | 7/1979 |

Primary Examiner—Khai Tran
Assistant Examiner—Khanh Cong Tran

(57) ABSTRACT

A method and apparatus to perform a real-time drift correction of a local oscillator in a wireless device such as a cordless telephone, and/or to perform software-based frequency tracking of the local oscillator. With respect to the real-time drift correction, the remote handset periodically wakes from a sleep mode and goes into a normal link verification mode. Once in the link verification mode, the remote handset enters a time division duplexing (TDD) mode and attempts to establish a link with a base unit based on the timing of the TDD data frame. After the remote handset establishes a link with the base unit, the remote handset requests a security word from the base unit. Upon receiving the requested security word, the remote handset determines if the requested security word matches a security word of the remote handset. The remote handset implements a software frequency adjustment of its local oscillator. Once per frame, the remote handset enters a timing recovery state where the current state of the frame is compared with a previous state. When the cumulative timing slip is greater than a designated threshold, a frequency adjustment is made. The remote handset continuously adjusts its local oscillator to achieve frequency alignment within, e.g., 1 part per million (ppm). Alternatively, frequency alignment may be achieved to a specified value. Frequency feedback control may be software based to allow frequency tracking between two remote points in a communication system. In this way, the desirability of any frequency correction at particular times may be based on the accuracy of the recovered timing and data, the sensitivity of the mode of the receiving device, etc. For instance, the frequency can be finely adjusted during system acquisition, can be coarsely adjusted during data transfer, and/or can be programmed to essentially ignore or disregard a frequency offset which would otherwise be determined based on erroneously received data and/or timing (e.g., based on frame error information).

34 Claims, 13 Drawing Sheets

U.S. PATENT DOCUMENTS

| | | | |
|---|---|---|---|
| 5,416,779 A | | 5/1995 | Barnes et al. |
| 5,953,648 A | | 9/1999 | Hutchison, IV et al. |
| 5,999,580 A | * | 12/1999 | Sakoda et al. ............... 375/354 |
| 6,125,124 A | * | 9/2000 | Junell et al. ................ 370/503 |
| 6,148,187 A | * | 11/2000 | Chiba ...................... 455/192.2 |
| 6,304,517 B1 | * | 10/2001 | Ledfelt et al. ................ 368/10 |
| 6,314,145 B1 | * | 11/2001 | van Driest .................. 375/326 |
| 6,466,630 B1 | * | 10/2002 | Jensen ........................ 375/327 |
| 6,473,607 B1 | * | 10/2002 | Shohara et al. .......... 455/343.1 |
| 6,587,694 B1 | * | 7/2003 | Mooney et al. ............. 455/502 |
| 6,650,874 B1 | * | 11/2003 | Banik et al. ................... 455/71 |

* cited by examiner

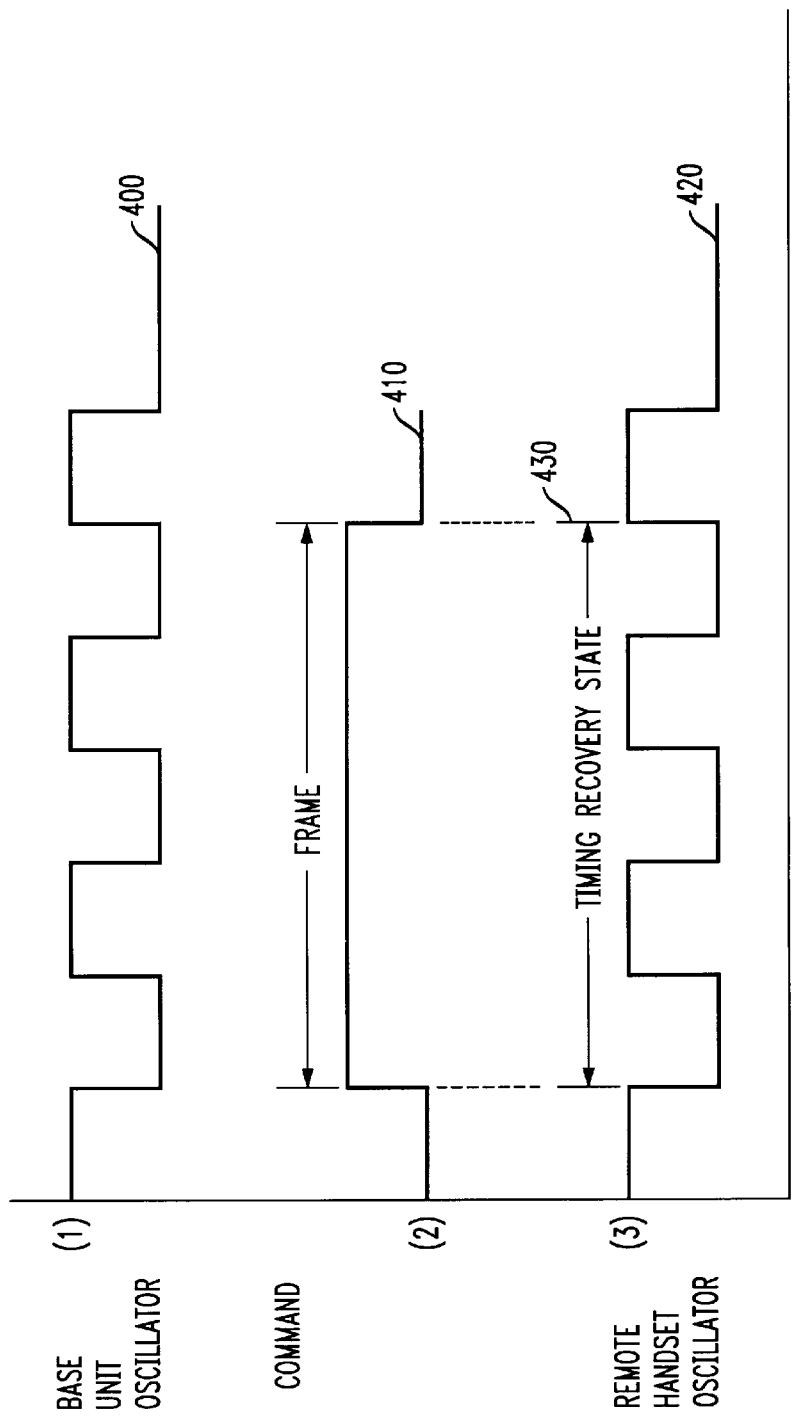

INTELLIGENT SOFTWARE CONTROLLED CORRECTION OF FREQUENCY TRACKING FOR A LOCAL OSCILLATOR OF A RECEIVER OF A WIRELESS DEVICE

BACKGROUND OF THE INVENTION

1. Field of the Invention

This invention relates generally to wireless devices. More particular, the invention relates to the intelligent software controlled correction of a frequency of a local clock signal in a wireless receiving device.

2. Background of Related Art

Wireless devices in general have gained in popularity over the years, and can now be found in many if not most homes or businesses. For instance, digital cordless telephones are now common in many homes and small offices. A cordless telephone is one in which the handset is not wired to its base unit, but instead uses wireless communication techniques between a remote handset and its base unit. While early cordless telephones transmitted analog signals, more recent advances in technology have introduced digital cordless telephones wherein the audio signals between the wireless devices are digitized and passed using digital signal transmission techniques (e.g., frequency shift keying (FSK) or quadrature amplitude modulation (QAM)).

FIG. 8A illustrates a typical remote handset 800 of a digital cordless telephone.

The remote handset 800 includes a controller 805, a coder-decoder (CODEC) 810, a speaker 815, a microphone 820, a radio frequency (RF) transceiver 825, a local oscillator 830, an EEPROM 835, a keypad 840, a timing recovery circuit 845 and a program ROM 837.

In the transmit direction, the microphone 820 outputs an analog signal to the CODEC 810, which converts the microphone input signal to a digital microphone signal. As part of the conversion process, a clock signal is provided from the local oscillator 830 for the CODEC 810 to sample the microphone signal. The digital microphone signal is then passed to the RF transceiver 825 for encoding into a radio frequency (RF) signal for transmission to a complementary base unit. The controller 805 also retrieves frequency control information from the EEPROM 835 to select the frequency that the RF transceiver 825 transmits. The program ROM 837 also provides a storage medium for the software that operates the remote handset 100 and for a security word.

In the receive direction, the RF transceiver 825 receives a RF signal from the complementary base unit. The RF transceiver 825 converts the RF signal to a digital signal that is passed to the CODEC 810 for decoding. The timing recovery circuit 845 provides correction information to the controller 805 to adjust the local oscillator 830 for the decoding of the digital signal. The output of the CODEC 810 is an analog signal for output by the speaker 815.

FIG. 8B illustrates a base unit 850 of the digital cordless telephone. The base unit 850 contains circuitry which is complementary to that contained in the remote digital handset 800, i.e., a complementary RF transceiver 870, a controller 855, a CODEC 860, an EEPROM 880, a program ROM 882, a timing recovery circuit 885 and a local oscillator 875. The base unit 850 also includes a telephone line interface 865 to interface with a public switched telephone network and a ring detect circuit 890 to detect the ring signal corresponding to an incoming telephone call.

For optimum performance between the remote handset 800 and the base unit 850, both local oscillators, 830 and 875, typically need to be frequency aligned. This is particularly true when an RF frequency is generated from a lower frequency master clock signal. In such a case, the master clock signal must be very finely adjusted because any baseband offset error will be multiplied by several orders of magnitude to create a much larger RF frequency offset compared to that being utilized at the other end of the RF link. Voltage controlled oscillators (VCOs) are often used for this task where the control voltage is kept at the desired level using a hardware circuit such as a phase locked loop (PLL).

In a typical application, the handset's local oscillator 830 ordinarily needs to be frequency aligned with the base unit's local oscillator 875 to within a few parts per million (ppm) for reliable and noise-free communication. However, in the real-world, a local oscillator may drift for a variety of reasons. A temperature change, a voltage change, or a tolerance variation in the components used in the digital cordless telephone may contribute to local oscillator drift.

There are several ways to correct for local oscillator drift. One method is called a coarse frequency search. A remote handset of a cordless telephone in the coarse frequency search will adjust the remote handset's oscillator to within a range of 5 ppm from as far off as 300 ppm. The coarse frequency search may be performed at any time, but its purpose is to achieve frequency alignment to within about 5 ppm at best. A coarse frequency search is very time-consuming, e.g., 1–2 sec., and will drain the remote handset's battery if done while the cordless telephone is off-hook.

Another method to correct for local oscillator drift is to use a synchronization bit(s) or frame. In a typical cordless telephone, a remote handset and a base unit communicate over the RF link using packets or frames. As part of the frame, several bits are reserved as synchronization bits.

FIG. 9 shows a conventional frame 900 with a synchronization field used in an RF link between a remote handset and a base unit of a digital cordless telephone.

In particular, as shown in FIG. 9, the frame 900 includes a data field 910, error correction code ("ECC") field 920 and a synchronization field 920. Each respective field includes a number of bits. The number of bits per field is dependent on the functionality of the field.

The data field 910 of the frame 900 typically contains the encoded voice signals.

The ECC field 920 of the frame 900 typically contains the error correction code for the data field 910. As the voice signals are encoded, typically, an error correction code is included in the frame 900 to ensure that the voice signals are properly transmitted and received.

The synchronization field 930 provides a method for a remote handset and base unit to frequency align by using the synchronization field to correct the receiving local oscillator or to derive a clock signal.

Although this method is effective, the synchronization field technique requires time for the receiving remote handset or base unit to frequency align. Moreover, this synchronization time may introduce unwanted delays in the communications between the base unit and the remote handset.

There is a need for an improved method and/or apparatus to frequency align a remote handset's local oscillator with a base unit's local oscillator to a high degree, e.g., to within 1 ppm for reliable and noise free communication.

SUMMARY OF THE INVENTION

In accordance with the principles of the present invention, a method to frequency track a local oscillator of a first wireless device with a clock signal of a second wireless device comprises determining a number of clock cycles during a length of a data symbol transmitted from the base unit to the remote handset. The determined number of clock cycles during the length of the transmitted symbol is compared to an expected number of clock cycles during the transmitted symbol. A frequency of the local oscillator is adjusted based on the comparison.

In accordance with another aspect of the present invention, an apparatus to frequency track a local oscillator of a first wireless device with a clock signal of a second wireless device comprises a local oscillator located within the first wireless device. A controller running a software module adjusts a frequency of the local oscillator only when a comparison of a number of clock cycles between boundaries of a received symbol differ by more than a predetermined threshold from an expected number of clock cycles. The predetermined threshold is non-zero.

BRIEF DESCRIPTION OF THE DRAWINGS

Features and advantages of the present invention will become apparent to those skilled in the art from the following description with reference to the drawings, in Which:

FIG. 4A illustrates a timing diagram of a timing recovery state for a frequency aligned remote handset oscillator.

DETAILED DESCRIPTION OF ILLUSTRATIVE EMBODIMENTS

The present invention frequency aligns a local oscillator of a remote handset with a local oscillator of a base unit in a digital cordless telephone.

In particular, the present invention provides for a periodic fine adjustment at regular intervals of a remote handset's local oscillator while the remote handset is in its standby (sniff) mode. Advantageously, the frequency alignment operation can take less than 400 ms every minute, and thus will not interfere with the normal operations of the digital cordless telephone, while continuously maintaining frequency alignment.

Alternatively, link verification may be done less frequently based on oscillator drift characteristics under assumed temperature and voltage conditions. A longer link verification duration may exist and allow for greater times between scheduled verifications.

The real-time drift correction of a remote handset's local oscillator, in accordance with the principles of the present invention, begins with the remote handset in a standby (sniff) mode. The remote handset periodically awakens from a sleep mode, e.g., every one-minute (or some other predetermined interval) and goes into a normal link verification mode.

Once in the link verification mode, the remote handset enters a time division duplexing (TDD) mode and attempts to establish a link with the base unit.

After the remote handset establishes a link with the base unit, the remote handset requests a security word from the base unit. Upon receiving the requested security word, the remote handset determines if the requested security word matches the security word of the remote handset. During this exchange of commands between the remote handset and the base unit, the remote handset continuously adjusts its local oscillator to achieve frequency alignment within, e.g., 1 part per million (ppm) to the frequency of the local oscillator of the base unit. Alternatively, frequency alignment may be achieved within a user-specified ppm value.

The remote handset achieves frequency alignment during the command exchange by implementing a software frequency adjustment of its local oscillator in a controller of the remote handset. Since a command occupies a frame, the controller of the remote handset enters a timing recovery state once during the frame where the current timing of the frame is compared with a previous timing. When a cumulative timing slip is greater than a designated threshold, a frequency adjustment is made. Thus, frequency alignment is achieved in a rapid fashion.

Figure 1A:
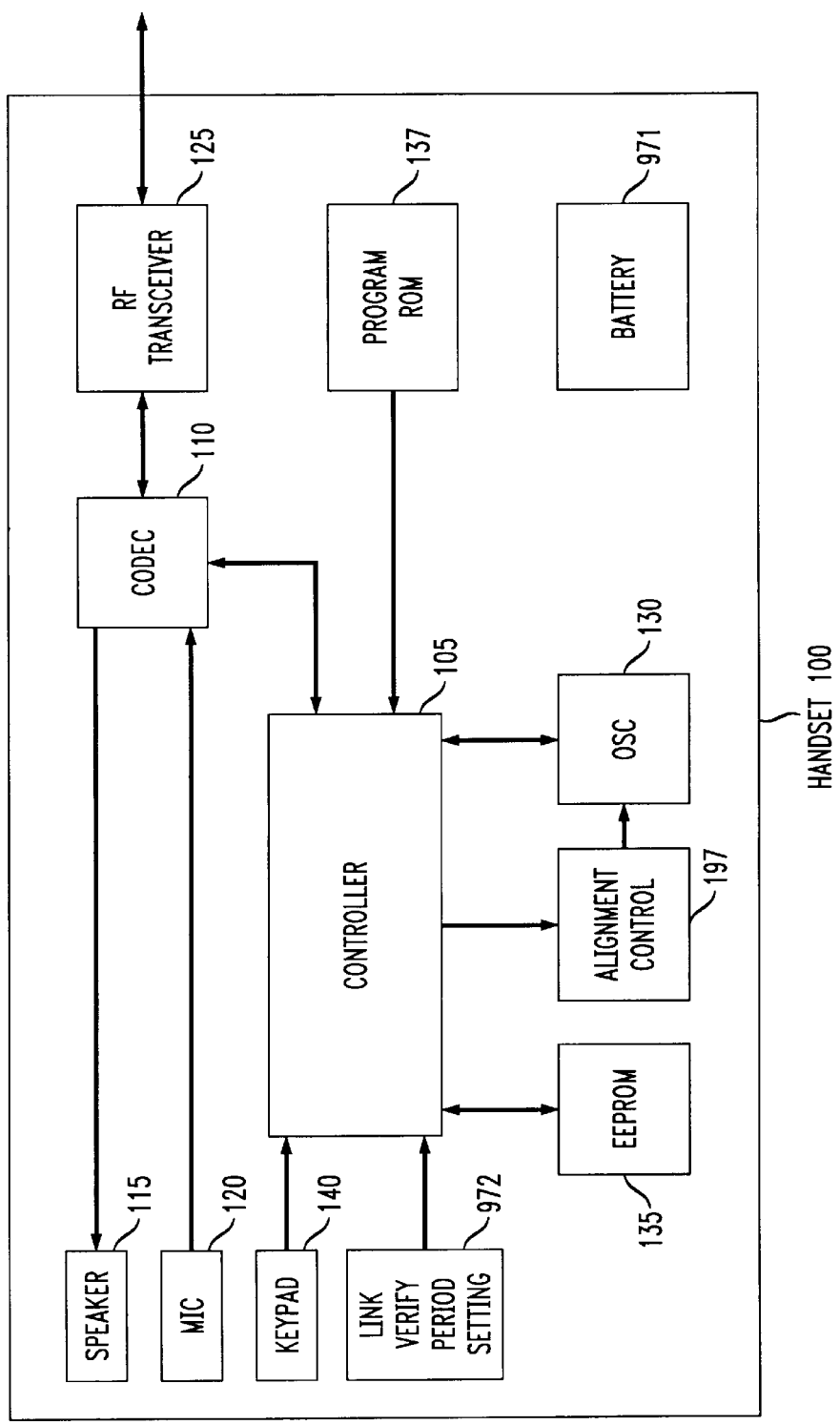
FIG. 1A illustrates a block diagram of a remote handset of a digital cordless telephone implementing a real-time drift correction of a local oscillator.

FIG. 1A is an illustration of an embodiment of a remote handset 100 of a digital cordless telephone implementing a real-time slow drift correction of a local oscillator.

In particular, FIG. 1A shows a block diagram of a remote handset 100 implementing a real time slow drift correction of a local oscillator. The remote handset 100 includes a controller 105, a coder-decoder (CODEC) 110, a speaker 115, a microphone 120, a radio-frequency (RF) transceiver 125, a local oscillator 130, an EEPROM 135, a program ROM 137, a keypad 140, an alignment control 197, a battery 971, and a link verify period setting 972, The controller 105 may be a digital signal processor (DSP), microprocessor, microcontroller, or combinational logic. The controller 105 provides an execution platform to execute a suitable software program to operate the remote handset 100.

The CODEC 110 provides a way to convert between analog voice signals and digital voice signals. The CODEC 110 is an electronic device that converts analog voice signals to digital voice signals via an analog-to-digital converter. Also, the CODEC 110 converts received digital voice signals to analog voice signals via a digital-to-analog converter.

The CODEC 110 converts between the analog and digital signals based on a clock signal provided by the local oscillator 130. The local oscillator 130 may be a voltage-controlled oscillator ("VCO") where a control voltage may alter the output frequency of the local oscillator 130 by the alignment control 197 under the control of the controller 105.

The microphone 120 provides a way for the user to input voice signals into the remote handset 100.

The speaker 115 provides a way for the user to hear the output voice signals from the remote handset 100.

The RF transceiver 125 provides an RF interface between the remote handset 100 and a complementary base unit. The remote handset 100 relays voice signals between a base unit via an RF link. The RF transceiver 125 provides a conversion between RF signals and the digitized voice signals.

The program ROM 137 provides a storage medium to store software that operates the remote handset 100. The EEPROM 135 stores frequency control information such as a digital-to-analog converted (DAC) value of the frequency, and a security word. The DAC value is used to control the frequency of the local oscillator 130 of the remote handset. The security word is used during exchanges between an exclusively matched set of, e.g., a remote handset and its base unit.

The keypad 140 provides a way for the user to operate the digital cordless telephone.

The battery 971 provides power to the remote handset 100.

The link verify period setting timer 972 provides a way to program how often the remote handset 100 corrects the drift of its local oscillator 130.

In the transmit direction, the microphone 120 outputs an analog signal to the CODEC 110, which converts the microphone input signal to a digital microphone signal. The digital microphone signal is input to the RF transceiver 125 for encoding into a digital signal for transmission to a complementary base unit. The controller 105 directs the output from the local oscillator 130 to encode the digital microphone signal. The controller 105 also retrieves frequency control information from the EEPROM 135 to select the frequency that the RF transceiver 125 transmits.

In the receive direction, an RF transceiver 125 receives an RF signal from the complementary base unit. The RF transceiver 125 converts the received signal to a digital signal that is then passed to the CODEC 110 for decoding. The local oscillator 130 provides a clock signal via the controller 105 to the CODEC 110. The output of the CODEC 110 is an analog voice signal for output by the speaker 115.

Figure 1B:
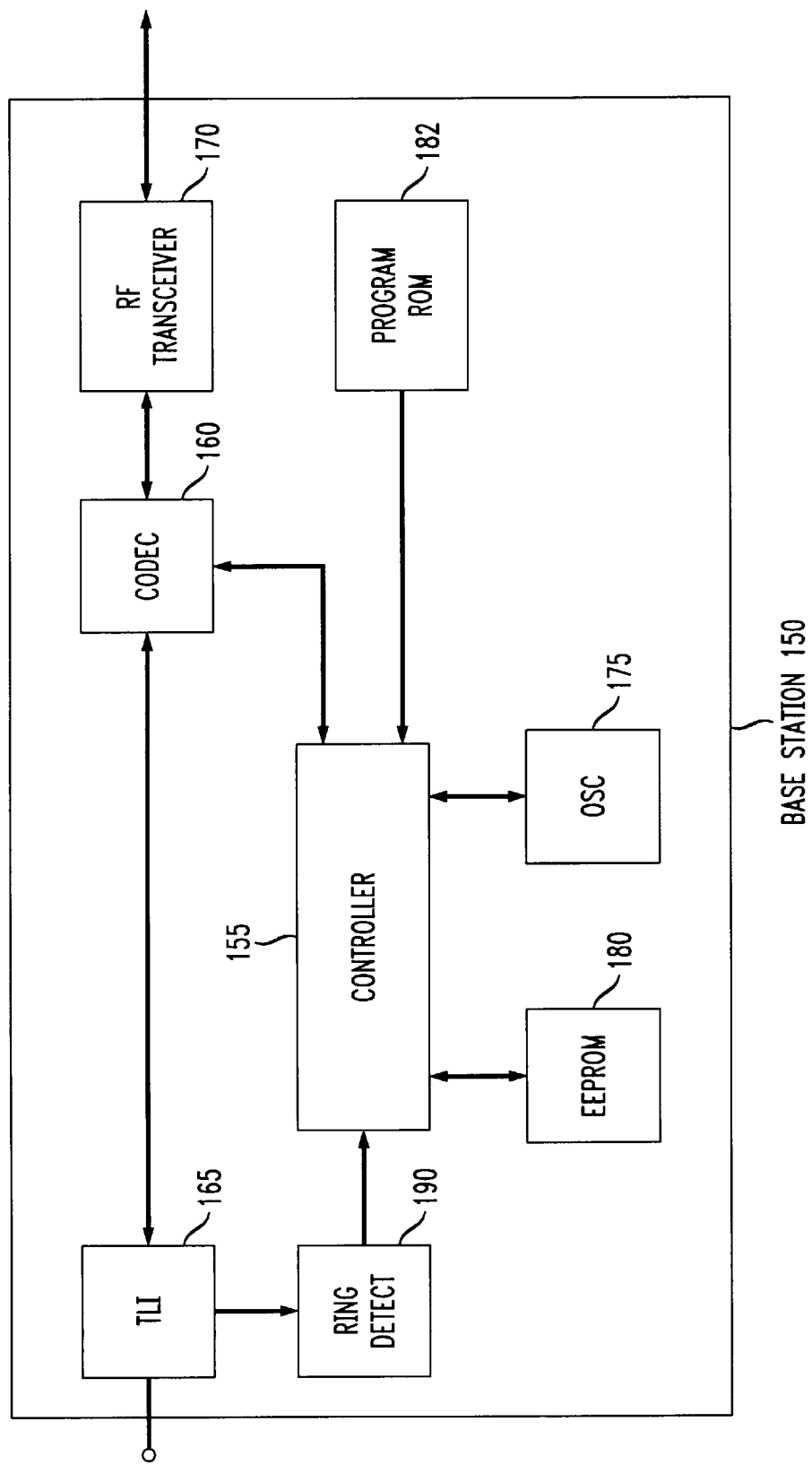
FIG. 1B illustrates a block diagram of a base unit of a digital cordless telephone implementing a real-time drift correction of a local oscillator of the remote handset of FIG. 1A.

FIG. 1B illustrates a base unit 150 of the digital cordless telephone. The base unit 150 contains circuitry which is complementary to that contained in the remote handset 100, i.e., a complementary. RF transceiver 170, a controller 155, a CODEC 160, an EEPROM 180, a program ROM 182 and a local oscillator 175. The base unit 150 also includes a telephone line interface 165 to interface with a public switched telephone network. A ring detect circuit 190 detects the ring voltage relating to an incoming telephone call.

Figure 2:
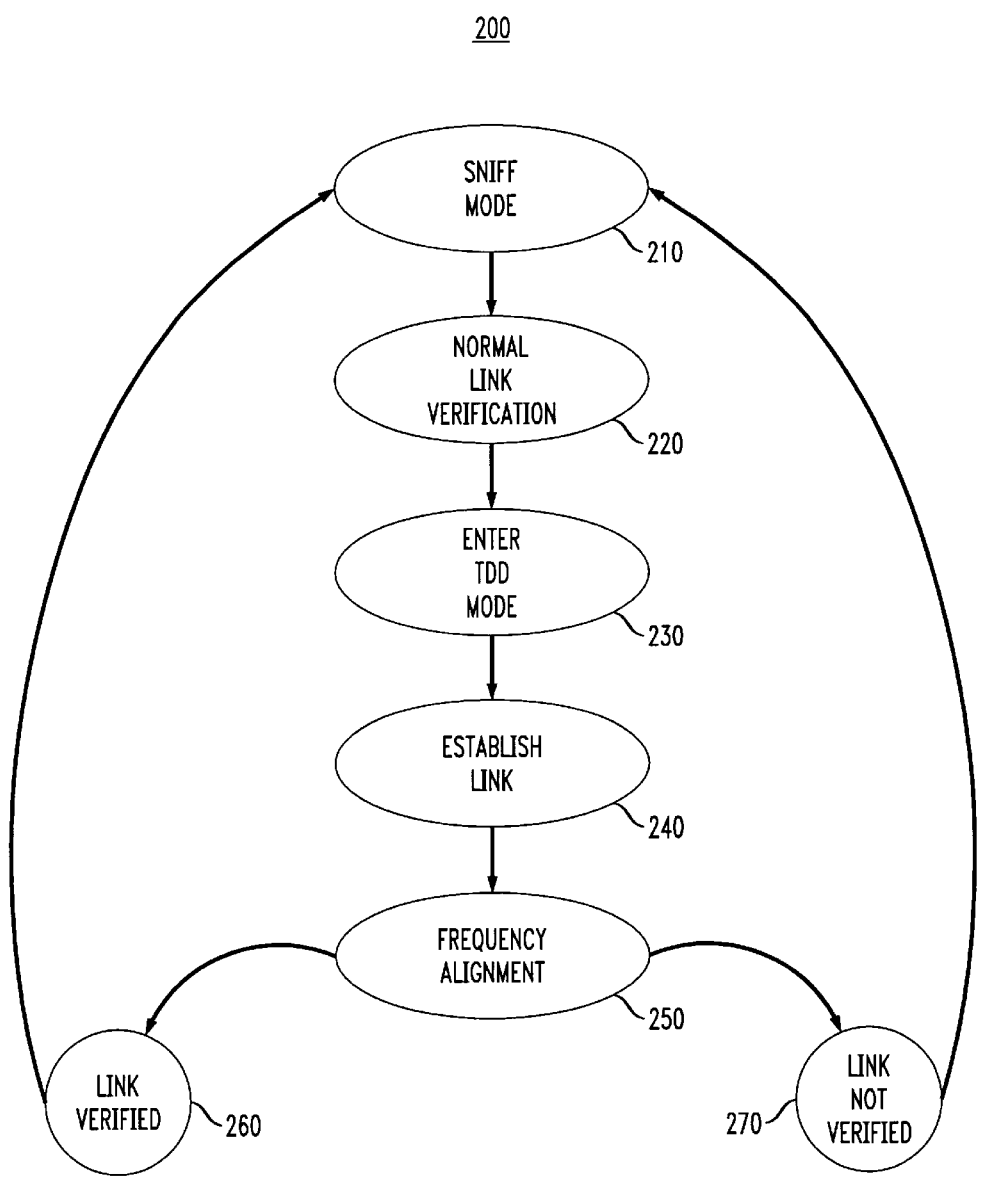
FIG. 2 illustrates an exemplary high-level flow diagram of a real-time drift correction of a local oscillator for a remote handset.

FIG. 2 shows an embodiment of a real-time slow drift correction of a local oscillator 130 used in the remote handset 100 of the digital cordless telephone such as that shown in FIG. 1A.

In particular, FIG. 2A shows an example of a software state module 200 affected by the real-time slow drift correction of the local oscillator 130 implemented by the controller 105 of the remote handset 100 shown in FIG. 1A.

In step 210, the controller 105 places the remote handset 100 in a sniff mode. The sniff mode is a standby mode of operation for the remote handset 100. While in the sniff mode, the remote handset 100 is able to conserve power while monitoring the RF link for incoming transmissions from the base unit 150.

Periodically, the controller 105 of the remote handset 100 disengages from a sleep or standby mode that conserves battery life to begin a normal link verification, as shown in step 220. The controller 105 may initiate the normal link verification at a pre-determined interval such as every one-minute or other pre-defined interval.

Once in the normal link verification, the remote handset 100 enters into a time domain duplex (TDD) mode, as shown in step 230.

Once in the TDD mode 230, the remote handset 100 attempts to establish an RF link with the base unit 150, as shown in step 240. The local oscillator 130 of the remote handset 100 is controlled by a DAC value written by the controller 105. The controller 105 retrieves the last used DAC value relating to the frequency timing from the EEPROM 135, and subsequently initiates a link verification. The last used DAC value is stored in the EEPROM 135 prior to entering the sniff mode.

Step 250 shows the frequency alignment phase. After the RF link is established, the remote handset 100 requests a unique security word from the base unit 150. After the unique security word is received by the remote handset 100, the controller 105 determines if the received security word matches the remote handset security word. During this exchange of commands, the controller 105 of the remote handset 100 continuously adjusts its local oscillator 130 to achieve frequency alignment within 1 ppm (or some pre-defined ppm).

One aspect of the present invention is the correction of a local oscillator 130 to achieve frequency alignment without the use of a specific circuit. Instead, the frequency correction of the local oscillator 130 is accomplished using a software module implemented by the controller 105.

Figure 3:
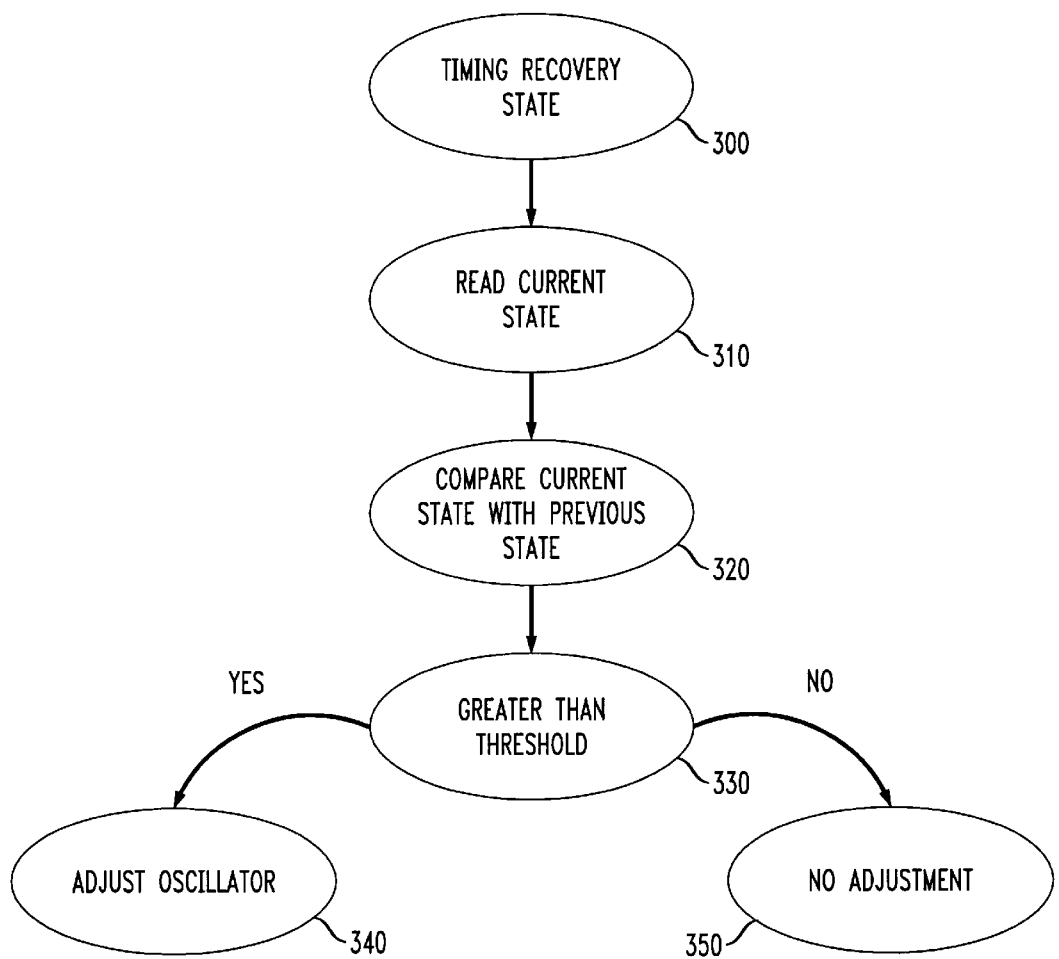
FIG. 3 illustrates an exemplary flow diagram of the frequency alignment phase of the real-time drift correction of a local oscillator in FIG. 2.

FIG. 3 is a more detailed flow diagram of the frequency alignment phase 250 of the real time slow drift correction of the alignment of the local oscillator 130 of the remote handset 100 shown in FIG. 2, in accordance with the principles of the present invention.

Within the frequency alignment phase, step 250, there is an exchange of commands that allows the local oscillator 130 of the remote handset 100 to frequency align. In typical digital cordless telephones, the commands that are exchanged are predetermined fixed size frames.

Once the controller 105 of the remote handset 100 is in the frequency alignment phase 250, the controller 105 enters into a timing recovery state, as shown in step 300, upon receiving a command from the base unit 150.

Upon receipt of the command, the controller 105 of the remote handset 100 reads the current timing state of the received frame, as shown in step 310.

In step 320, the current timing state of the received frame is compared with a previous timing state.

In step 330, if the timing difference or slip between the timing states is greater than a predetermined threshold, the controller 105 of the remote handset 100 adjusts the local oscillator 130, as shown in step 340. Alternatively, a series of comparisons may be implemented to tally a cumulative timing slip to be compared against the predetermined threshold.

Otherwise, the controller 105 of the remote handset 100 does not adjust the local oscillator 130, as shown in step 350. Subsequently, returning to FIG. 2, the controller 105 finishes the frequency alignment phase 250, and proceeds to step 260 or step 270.

FIG. 4A better illustrates the timing recovery state 300 of FIG. 3 in a timing diagram showing a base unit oscillator, a data frame, and a remote handset oscillator during a previous read operation.

In particular, a base unit oscillator output is represented by a base unit clock signal 400 as shown in waveform (1).

A remote handset oscillator is represented by a remote handset clock signal 420 as shown in waveform (3).

When the remote handset 100 receives the command, the remote handset 100 enters into the timing recovery state 430 as shown in waveform (3). In the timing recovery state 430, the remote handset 100 is able to determine the timing based on the remote handset clock signal 420 as shown in waveform (3).

The controller 105 of the remote handset 100 may determine timing using various techniques. For example, the controller 105 may count the zero crossings in the data frame 410 or monitor a sub-symbol clock counter at the end of the data frame 410. Since the timing recovery state 430 is a fixed amount of time, the timing of the data frame 410 may be easily derived.

Subsequently, the value of the timing is retained to be compared against the next incoming command.

Figure 4B:
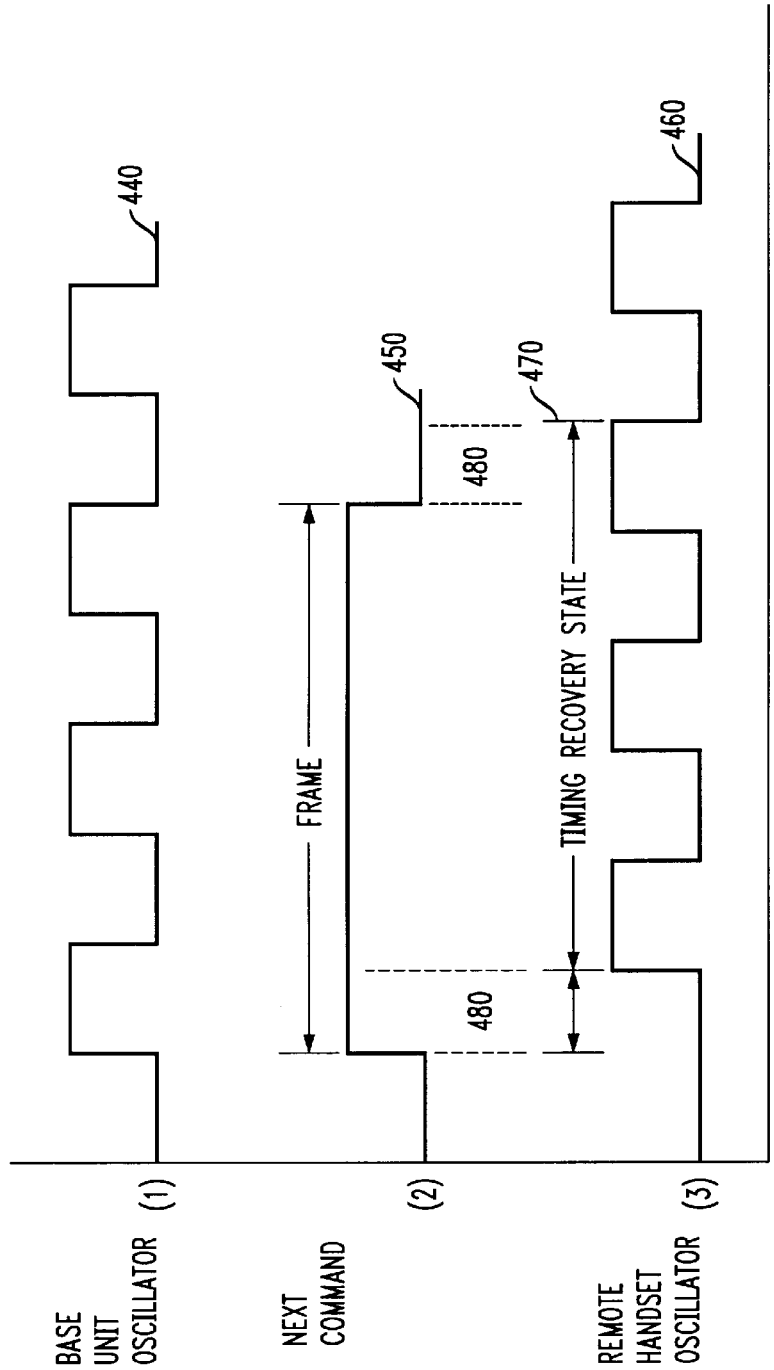
FIG. 4B illustrates a timing diagram of a timing recovery state for a drifted remote handset oscillator.

FIG. 4B illustrates a timing diagram of a base unit oscillator (waveform (1)), a data frame (waveform (2)), and a remote unit oscillator (waveform (3)) of a next incoming command when the remote unit oscillator 130 has drifted from the base unit oscillator 175.

As illustrated in FIG. 4B, the base unit oscillator is represented by the base unit clock signal 440 as shown in waveform (1). The command is represented as a data frame 450 as shown in waveform (2). The remote handset oscillator is represented by the remote unit clock signal 460 as shown in waveform (3).

As with FIG. 4A, a command is shown in waveform (3) as having been transmitted by the base unit 150 as a next frame 450 based on the base unit clock signal 440 as shown in waveform (1). However, in this event, the remote handset clock signal 460, shown in waveform (3) has drifted by the slip amount 480.

When the controller 105 of the remote handset 100 enters a timing recovery state 470, shown in waveform (3), the controller 105 determines the timing of the next frame 450. Since the remote handset clock signal 460 has drifted, the timing value of the next frame 450 differs by the value of the slip 480.

If the timing difference between the two commands is greater than some predetermined threshold, the local oscillator 130 of remote handset 100 may be adjusted. Alternatively, the timing differences between several received frames may be totaled and compared against a threshold to determine from an average or accumulated value whether or not the local oscillator 130 of the remote handset 100 needs to be adjusted.

The objective of this periodic link verification is to allow the remote handset to run for a time sufficiently long enough to track the slow drift of its local oscillator with respect to the base unit since the last correction was made. The last correction may have occurred during either a link verification or a normal traffic link. If the handset does not establish a link with the base unit within the time-out period (e.g., 400 or 800 msec), then the handset flags that condition as a link verification fail, LINK_VERIFY_NORM_FAIL. If the system fails to start up within 400 msec of establishing the link, that is also considered a link verification fail.

In another aspect, software control of the frequency of the local oscillator in a receiver of a wireless device can be used to intelligently adjust the frequency of the local oscillator at desirable times, and to ignore signs of the need for frequency adjustment at other times.

Figure 5:
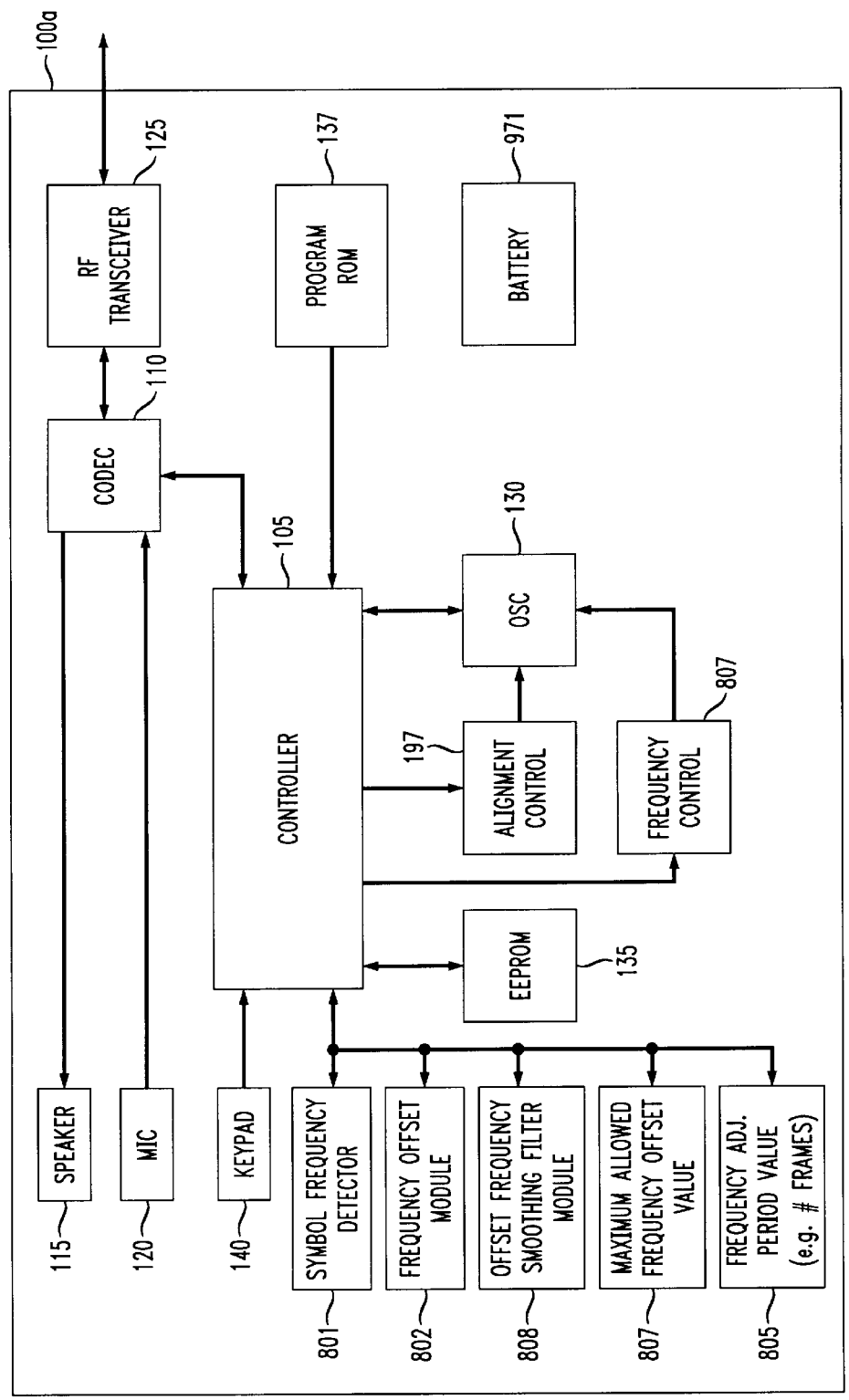
FIG. 5 illustrates a block diagram of a remote handset of a digital cordless telephone implementing an intelligent software correction of frequency of the local oscillator, in accordance with another aspect of the present invention.

In particular, FIG. 5 illustrates a block diagram of a remote handset of a digital cordless telephone implementing an intelligent software correction of frequency of the local oscillator, in accordance with another aspect of the present invention.

In FIG. 5, a wireless device such as a remote handset 100a Of a cordless telephone includes a frequency control module 807 between a controller 105 and a local oscillator 130. As in FIG. 1, the controller 105 may be any suitable processor (e.g., microcontroller, microprocessor, or digital signal processor (DSP)). Based on input to the controller 105, the controller 807 provides software control of the frequency of the oscillator 130 via the frequency control module 807. In the preferred implementation of the embodiment shown in FIG. 5, the local oscillator 130 is controlled with software feedback instead of solely with a conventional feedback hardware circuit, e.g., a PLL.

The disclosed embodiment relates to FSK data communications, which are non-coherent. Coherent detection typically requires a. PLL or similar device. However, with non-coherent detection, phase is not important, and the software feedback control shown in FIG. 5 can be suitably implemented.

The controller 105 includes various software-based modules 801–805 used to determine a frequency offset from the ideal, a determination of the ideal frequency, and implementation of the offset frequency to control the frequency of the local oscillator 130. The software-based modules 801–805 may be resident internal and/or external to the controller 105, but in any event are nevertheless preferably in communication with the controller 105.

The software-based modules to implement intelligent software feedback control of the frequency of the local oscillator 130 include, e.g., a symbol boundary detector 801, a frequency offset determination module 802, and an offset frequency filter module 803.

In addition to these particular programs, the controller 105 has access to various programmable values to allow intelligent control of the frequency tracking of the local oscillator 130 based on software determined parameters (e.g., a CRC error). For instance, the controller 105 may establish a storage location for a programmable value corresponding to a maximum allowed frequency offset value 804, and to a frequency adjustment period value 805.

In accordance with the principles of the present invention, frequency tracking between two remote points in a communication system is based in the receiver on a software determined frequency offset, and the programmed desirability of a frequency correction based on the given recovered timing and data. In this way, the frequency can be finely adjusted during system acquisition, during data transfer, and/or can be programmed to essentially ignore or disregard a frequency offset which would otherwise be determined based on erroneously received data and/or timing (e.g., based on frame error information).

Thus, together with the embodiments described with respect to FIG. 1A a control voltage for a local oscillator can be adjusted based either both on software detected timing recovery drifts of a local oscillator from frame to frame as well as on frame error (or correctness) information, or based on either the software detected timing recovery drifts of a local oscillator from frame to frame as well as on frame error or software detected timing recovery drifts of the local oscillator.

A communication system normally has a timing recovery circuit which locks onto an incoming data stream to recover a clock signal. This timing recovery circuit will typically include a hardware feedback circuit (e.g., a phase locked loop) to finely adjust and control, and thus track the incoming data clock. In accordance with the principles of the present invention, the adjustment and control of the receiver's local oscillator or other clock signal is handled with a software program on an intelligent basis. In this way, frequency tracking can be controlled with high resolution at desired times, low resolution at other times, and can be ignored altogether at still other times. Thus, intelligent frequency tracking is provided by software control of a receiver's local oscillator.

The software determines a need for adjustment of the local oscillator frequency based on clock cycles (e.g., of the local oscillator) within the boundaries of a received symbol.

Using software feedback control of the local oscillator, the frequency can be adjusted immediately, with a delay or hysteresis, and/or periodically after a period of time in response to a number of symbol frames to allow smoothing of the measurement of the actual frequency.

Following this measurement interval, a corresponding frequency adjustment can be calculated by the software module according to how much the timing recovery circuit has drifted relative to the local clock. Depending on the system's need for frequency accuracy and/or the rate of possible frequency drift, an arbitrarily precise accuracy may be achieved either by monitoring an arbitrarily long time interval, or by making an arbitrarily small adjustment to the frequency control whenever a time slippage is detected.

By controlling the frequency using software rather than hardware, frequency control is easily adapted to perform optimally for different environments and conditions and/or to allow for multiple conditions to be utilized, such as frame error rate, as part of that algorithm which might otherwise be difficult to take advantage of.

For example, using a software approach to feedback control of the frequency in accordance with the principles of the present invention, the speed of tracking adaptation can be easily adjusted to be more aggressive during an acquisition condition, and/or more stable during a steady state condition.

Frequency tracking in accordance with the principles of the present invention is based on timing recovery. In general, systems performing frequency tracking based on timing recovery could potentially have a problem when the input signal becomes of very poor quality. In such a case, the timing recovery circuit might not calculate accurate or precise frequency corrections. Under such conditions, since the timing recovery might erroneously drift, frequency tracking might otherwise drift as well. This invention can ensure that the problem does not occur.

In accordance with the principles of the present invention, a simple decision mechanism is used to turn off or otherwise disable frequency adjustments when bad data is detected.

The occurrence of bad data may be detected using any suitable technique, e.g., using a frame CRC or FEC syndrome check. In such a case, whenever a frame CRC or FEC syndrome check results in an error having been found, frequency adjustments based on a data frame including the erroneous data is preferably discarded.

For example, one effective and easy method to implement is as follows. Since communication packets are normally placed in frames, the software-based feedback frequency control can periodically or occasionally read a state of the timing recovery, e.g., once per frame. Whenever this read operation is performed, the current state of the timing recovery can be compared with the previous frame's timing recovery state. As a result of this comparison, whenever the software-based feedback frequency control detects a cumulative timing slip greater than a designated threshold over several frames, a frequency adjustment can then be made. Thus, frequency adjustment can be eliminated or at least held back for a period of time, differing from conventional hardware-based feedback timing control techniques (e.g., using PLLs) wherein the frequency adjustment is substantially immediate with respect to the recovered timing.

If any recovered data frame includes bad data as indicated, e.g., by a cyclic redundancy check (CRC), a cumulative value for a frequency adjustment can be essentially reset to zero, re-starting the timing recovery-based, allowing the re-determination of a more accurate offset frequency (if any) without the overbearing influence of a dropped data bit or other data error within one or even within a few data frames.

The threshold and/or the frequency adjustment step size can be programmably varied, allowing for an intelligently adjustable feedback frequency control, and resulting in as accurate and precise a receiving system as desired where both absolute accuracy as well as jitter may be arbitrarily accurate.

In practice, the software-based feedback frequency tracking control implemented in a cordless telephone application has achieved absolute frequency as,well as jitter accuracy well below 1 part-per-million (ppm).

Figure 9:
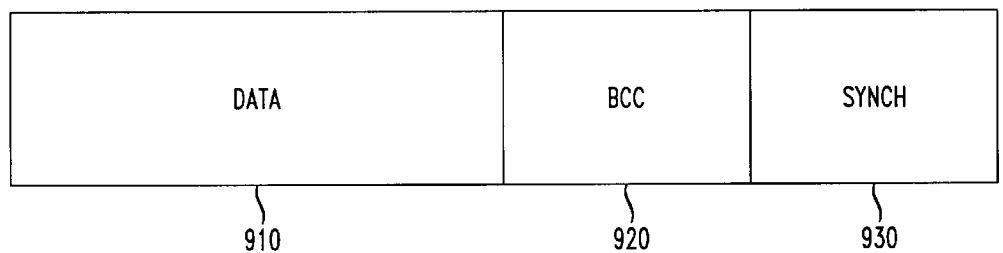
FIG. 9 shows a conventional frame with a synchronization field used in an RF link between a remote handset and a base unit of a digital cordless telephone.

FIGS. 9A and 9B are waveforms showing a relationship between a transmitted symbol and data clock and the corresponding received symbol and data clock, respectively.

Figure 6A:
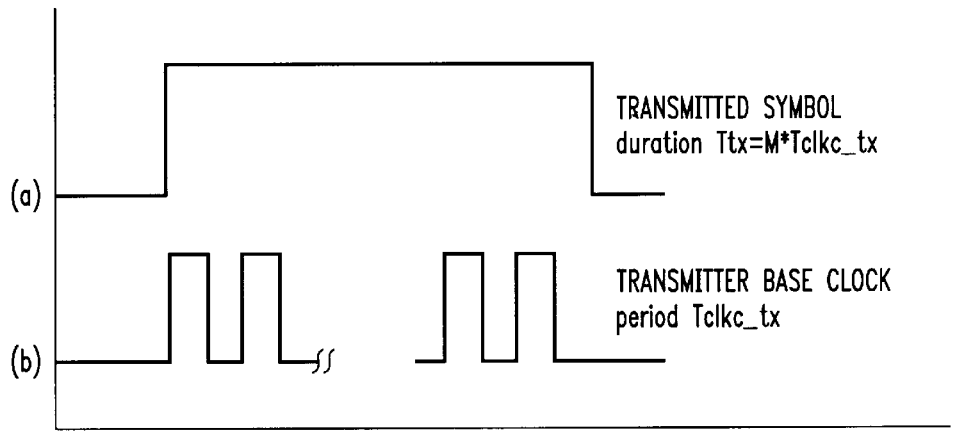
FIGS. 6A and 6B are waveforms showing a relationship between a transmitted symbol and data clock, and the corresponding received symbol and data clock, respectively.
Figure 6B:
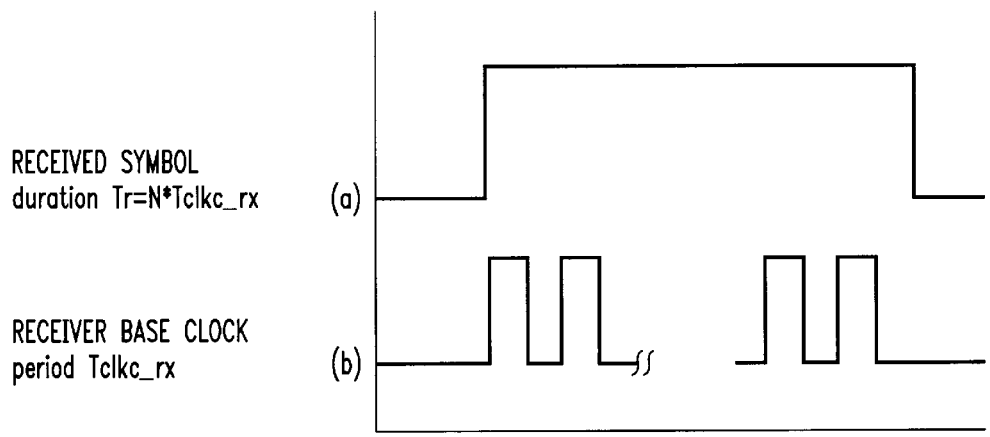

In waveforms (a) and (b) of 6A, a transmitted symbol (waveform (a)) is shown with respect to a transmitter base clock signal (waveform (b)). The received symbol is shown in waveform (a) of FIG. 6B, with the corresponding recovered timing shown in waveform (b) of FIG. 6B.

Figure 7A:
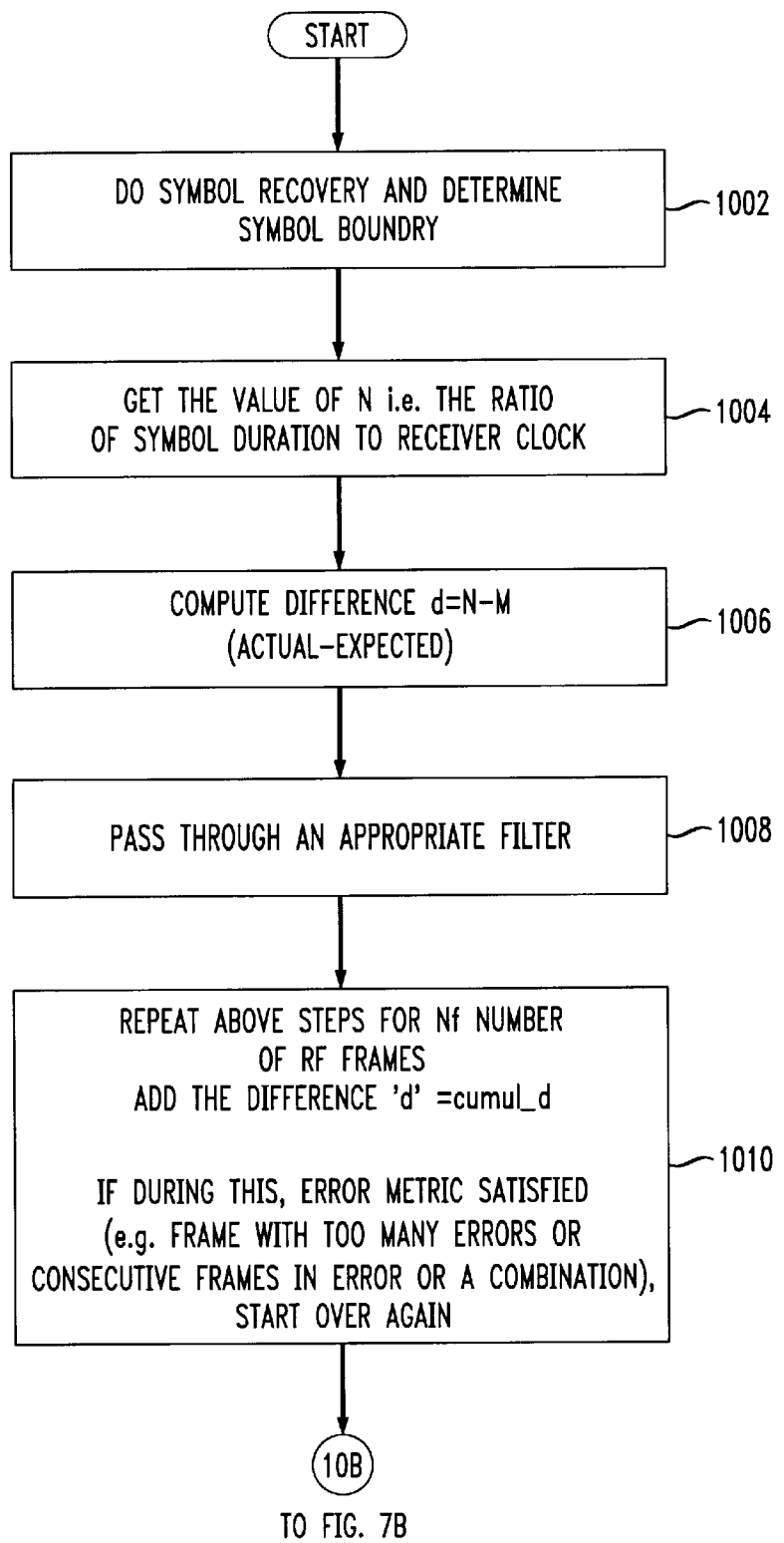
FIGS. 7A and 7B show an exemplary process flow chart implementing intelligent software adjustment of a local oscillator based on a relationship between a received symbol and its data clock, in accordance with the principles of an aspect of the present invention.
Figure 7B:
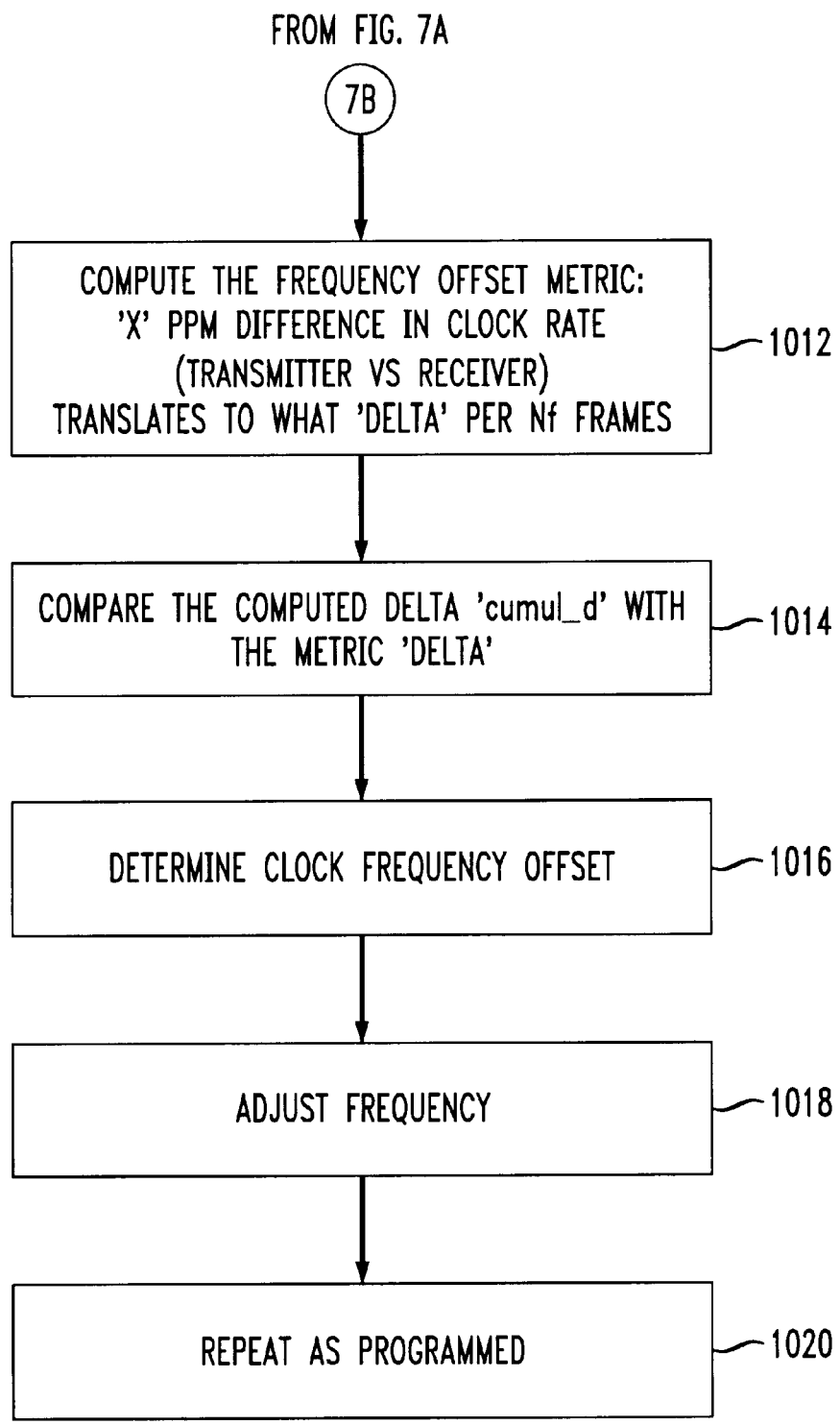
Figure 8A:
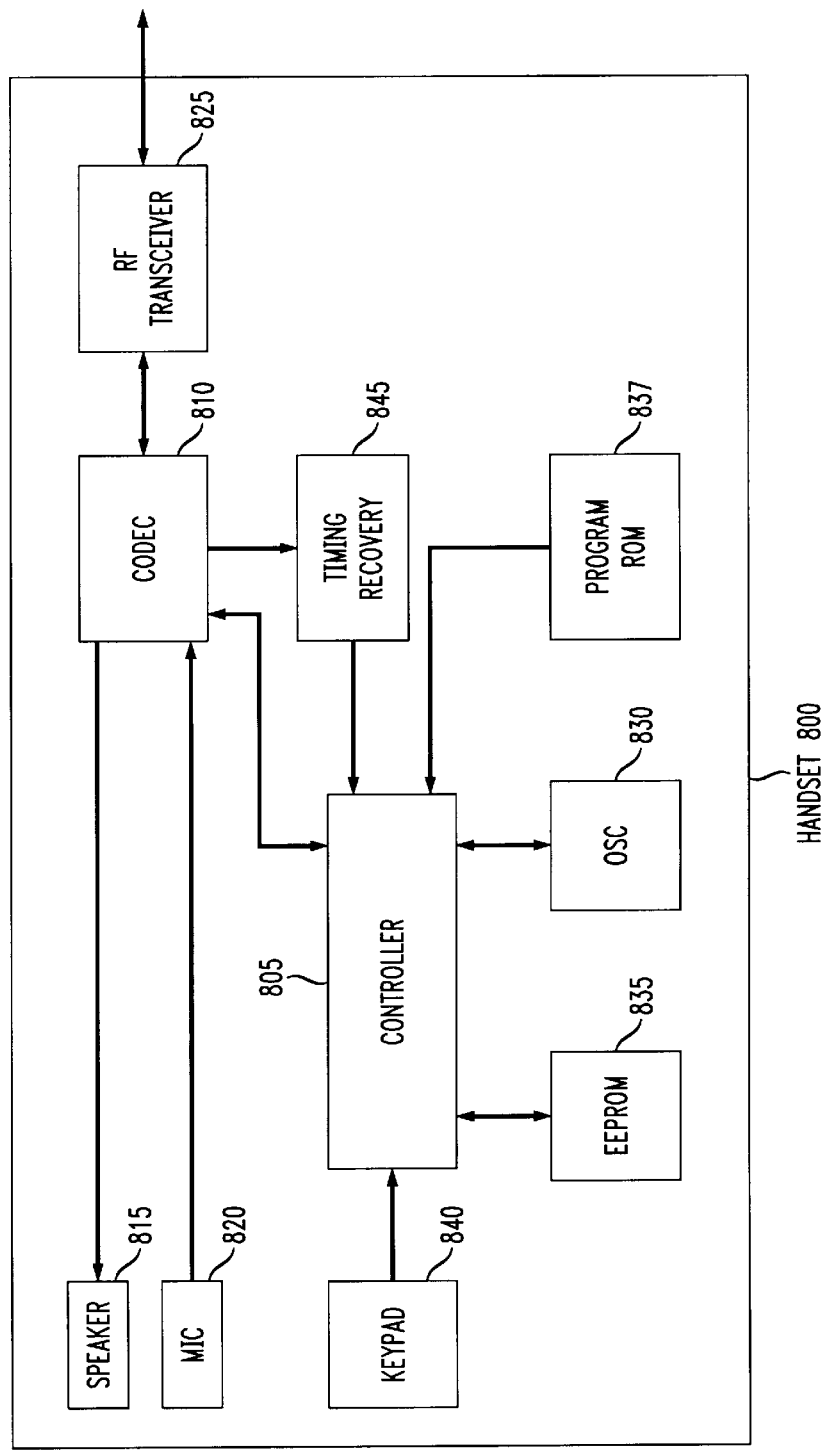
FIG. 8A shows a block diagram of a conventional remote handset of a digital cordless telephone.
Figure 8B:
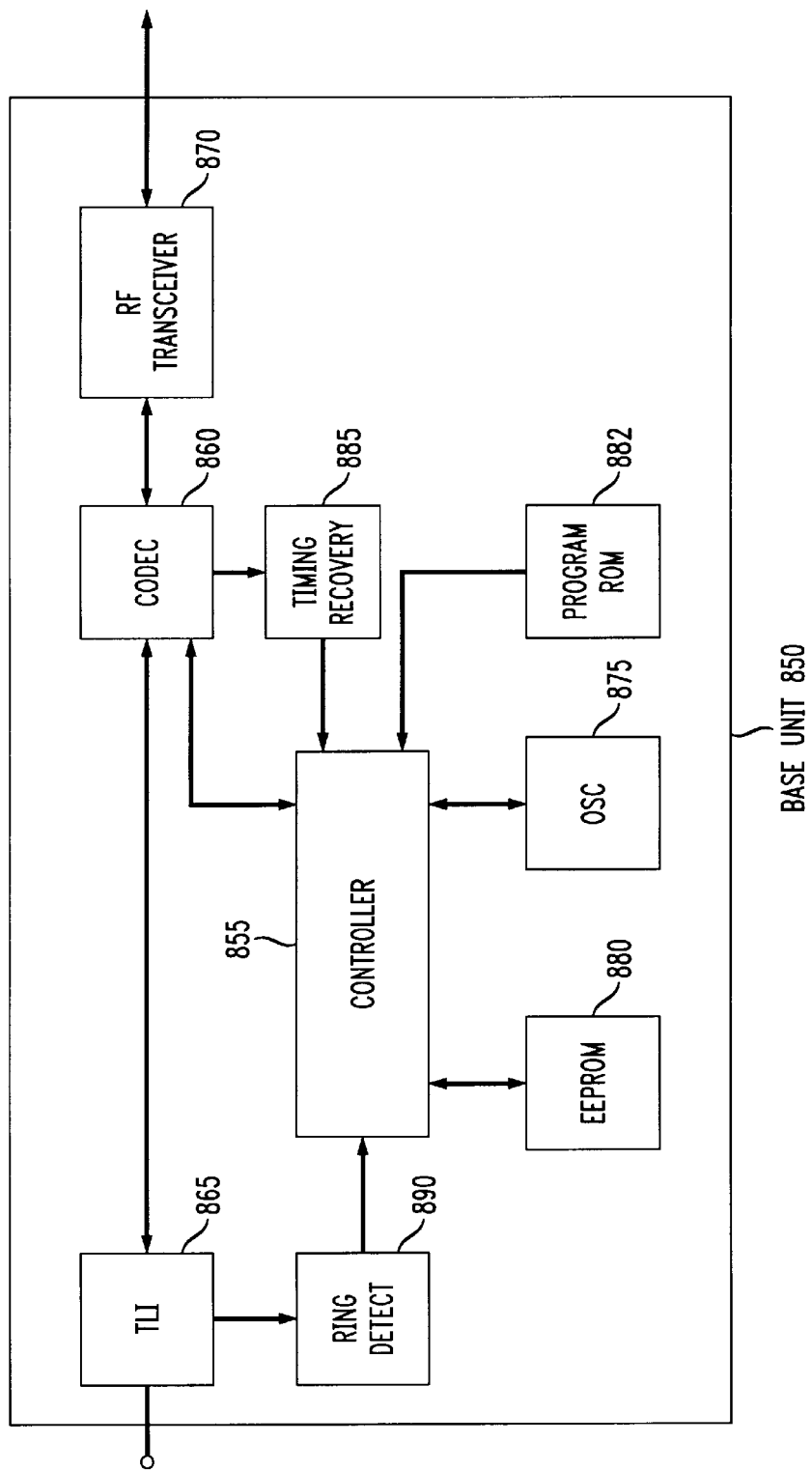
FIG. 8B shows a block diagram of a conventional base unit of a digital cordless telephone.

FIGS. 7A and 7B show an exemplary process flow chart implementing intelligent software adjustment of a local oscillator based on a relationship between a received symbol and its data clock, in accordance with the principles of an aspect of the present invention.

In step 1002 of FIG. 7A, the received symbol is recovered, and the boundaries of the recovered symbol are determined.

In step 1004, the error in the received timing is determined by counting a number of clock cycles within the received symbol boundaries determined in step 1002. In the given example, a ratio of the symbol duration to the local oscillator clock is determined.

In step 1006, a difference between the actual duration of the received symbol and the expected duration of the received symbol is determined.

Alternative mathematical operations between the expected and the actual symbol timing may be utilized. For instance instead of a difference as determined in step 1006, a ratio between the expected and the actual symbol timing, or a ratio between the actual symbol timing and the expected symbol timing may be used.

In step 1008, the individual results of a series of differences calculated in step 1006 may be filtered if desired, e.g., smoothed, to provide less volatile results.

In step 1010, the symbol recovery of step 1002, the determination of the ratio in step 1004, the computation of the difference in step 1006, and the results filtered in step 1008, are repeated for a programmable number of data symbols or data frames, as determined by the frequency adjustment period value 805. The accumulation in step 1010 is cleared, and the process returned to step 1002, if an error is detected in software relating to, e.g., too many data errors in a data frame, too many consecutive data frames including a data error, etc.

In step 1012, the maximum frequency offset is determined, or retrieved from memory in the maximum allowed frequency offset value 804.

In step 1014, the accumulated difference determined in step 1010 is compared to the desired threshold frequency offset allowed without adjustment, i.e., compared to the maximum allowed frequency offset value 804.

In step 1016, the frequency offset (if any) to be corrected through use of the frequency control 807 is determined.

In step 1018, the frequency control 807 is controlled by the controller 105 to the desired new frequency, based on the software determined frequency offset determined in step 1016.

In step 1020, the process of FIGS. 10A and 10B is repeated according to a desired schedule, desired period, etc.

The embodiment shown in FIGS. 8 to 10B is easily implemented in software without the need for including extra hardware dedicated to frequency tracking, saving on cost and minimizing system size, and providing programmable precision and robustness in frequency accuracy and jitter. Moreover, with the intelligent software control of the frequency adjustment conventionally handled by a hardware circuit such as a PLL, customization for different applications and conditions is easily achieved.

While the embodiment of FIGS. 8 to 10B is shown and described with respect to a digital cordless telephone, e.g., operating in the 900 MHz range in the United States, the principles of this aspect of the present invention are applicable to any wireless receiving device in general.

While the invention has been described with reference to the exemplary embodiments thereof, those skilled in the art will be able to make various modifications to the described embodiments of the invention without departing from the true spirit and scope of the invention.

What is claimed is:

1. A method to frequency track a local oscillator of a first wireless device with a clock signal of a second wireless device, said method comprising:

determining a number of clock cycles during a length of a data symbol transmitted from said first wireless device to said second wireless device;

comparing said determined number of clock cycles during said length of said transmitted symbol to an expected number of clock cycles during said transmitted symbol; and adjusting a frequency of said local oscillator only when said comparison of said number of clock cycles between boundaries of said transmitted symbol differ by more than a predetermined threshold.

2. The method to frequency track a local oscillator of a first wireless device with a clock signal of a second wireless device according to claim 1, wherein said comparison comprises:

a determination of a difference between said determined number of clock cycles during said length of said transmitted symbol and said expected number of clock cycles during said transmitted symbol.

3. The method to frequency track a local oscillator of a first wireless device with a clock signal of a second wireless device according to claim 1, wherein said comparison comprises:

a determination of a ratio between said determined number of clock cycles during said length of said transmitted symbol and said expected number of clock cycles during said transmitted symbol.

4. The method to frequency track a local oscillator of a first wireless device with a clock signal of a second wireless device according to claim 1, further comprising:

computing a frequency offset of said local oscillator based on said comparison.

5. The method to frequency track a local oscillator of a first wireless device with a clock signal of a second wireless device according to claim 1, wherein:

said comparison is performed on transmitted symbols.

6. The method to frequency track a local oscillator of a first wireless device with a clock signal of a second wireless device according to claim 5, further comprising:

smoothing a result of said comparisons performed on each of said plurality of transmitted symbols.

7. The method to frequency track a local oscillator of a first wireless device with a clock signal of a second wireless device according to claim 6, wherein:

if any of said comparisons result in a frame error above a predetermined threshold, re-start said step of comparing with a new plurality of transmitted symbols.

8. The method to frequency track a local oscillator of a first wireless device with a clock signal of a second wireless device according to claim 1, wherein:

said first wireless device is a remote handset of a cordless telephone; and said second wireless device is a base unit of said cordless telephone.

9. The method to frequency track a local oscillator of a first wireless device with a clock signal of a second wireless device according to claim 1, further comprising:

recovering said transmitted symbol; and determining boundaries of said symbol.

10. The method to frequency track a local oscillator of a first wireless device with a clock signal of a second wireless device according to claim 1, wherein:

said step of adjusting said frequency of said local oscillator based on said comparison is performed only if said comparison results in a frame error greater than a predetermined threshold.

11. The method to frequency track a local oscillator of a first wireless device with a clock signal of a second wireless device according to claim 1, wherein:

said adjustment of said frequency of said oscillator is performed on a frame-by-frame basis.

12. The method to frequency track a local oscillator of a first wireless device with a clock signal of a second wireless device according to claim 1, wherein:

said adjustment of said frequency of said oscillator is determined based on a cumulative basis over a plurality of data frames each containing a plurality of symbols.

13. An apparatus to frequency track a local oscillator of a first wireless device with a clock signal of a second wireless device, comprising:

a local oscillator located within said first wireless device; and a controller running a software module adapted to adjust a frequency of said local oscillator only when a comparison of a number of clock cycles between boundaries of a received symbol differ by more than a predetermined threshold from an expected number of clock cycles, said predetermined threshold being non-zero.

14. The apparatus to frequency track a local oscillator of a first wireless device with a clock signal of a second wireless device according to claim 13, wherein:

said differences determined using a ratio between said number of clock cycles between boundaries of said received symbol and said expected number of clock cycles.

15. The apparatus to frequency track a local oscillator of a first wireless device with a clock signal of a second wireless device according to claim 13, wherein:

said difference is determined by performing subtraction between said number of clock cycles between boundaries of said received symbol and said expected number of clock cycles.

16. An apparatus to frequency track a local oscillator of a first wireless device with a clock signal of a second wireless device according to claim 13, wherein:

said first wireless device is a remote handset of a cordless telephone; and said second wireless device is a base unit of said cordless telephone.

17. Apparatus for frequency tracking a local oscillator of a first wireless device with a clock signal of a second wireless device, comprising:

means for determining a number of clock cycles during a length of a data symbol transmitted from said first wireless device to said second wireless device;

means for comparing said determined number of clock cycles during said length of said transmitted symbol to an expected number of clock cycles during said transmitted symbol; and means for adjusting a frequency of said local oscillator only when said comparison of said number of clock cycles between boundaries of said transmitted symbol differ by more than a Predetermined threshold.

18. The apparatus for frequency tracking a local oscillator of a first wireless device with a clock signal of a second wireless device according to claim 17, wherein said means for comparing comprises:

means for determining a difference between said determined number of clock cycles during said length of said transmitted symbol and said expected number of clock cycles during said transmitted symbol.

19. The apparatus for frequency tracking a local oscillator of a first wireless device with a clock signal of a second wireless device according to claim 17, wherein said means for comparing comprises:

means for determining a ratio between said determined number of clock cycles during said length of said transmitted symbol and said expected number of clock cycles during said transmitted symbol.

20. The apparatus for frequency tracking a local oscillator of a first wireless device with a clock signal of a second wireless device according to claim 17, further comprising:

means for computing a frequency offset of said local oscillator based on said comparison.

21. The apparatus for frequency tracking a local oscillator of a first wireless device with a clock signal of a second wireless device according to claim 17, wherein:

said means for comparing compares each of a plurality of transmitted symbols.

22. The apparatus for frequency tracking a local oscillator of a first wireless device with a clock signal of a second wireless device according to claim 21, wherein, if any of said comparisons by said means for comparing result in a frequency tracking error above a predetermined threshold:

means for re-starting said means for comparing with a new plurality of transmitted symbols.

23. The apparatus for frequency tracking a local oscillator of a first wireless device with a clock signal of a second wireless device according to claim 17, wherein:

said first wireless device is a remote handset of a cordless telephone; and said second wireless device is a base unit of said cordless telephone.

24. The apparatus for frequency tracking a local oscillator of a first wireless device with a clock signal of a second wireless device according to claim 17, further comprising:

means for recovering said transmitted symbol; and means for determining boundaries of said symbol.

25. A method to frequency track a local oscillator of a first wireless device with a clock signal of a second wireless device, said method comprising:

determining a number of clock cycles during a length of a data symbol transmitted from said first wireless device to said second wireless device, said data symbol comprising link verification data;

comparing said determined number of clock cycles during said length of said transmitted symbol to an expected number of clock cycles during said transmitted symbol; and adjusting a frequency of said local oscillator based on said comparison.

26. The method to frequency track a local oscillator of a first wireless device with a clock signal of a second wireless device according to claim 25, wherein said comparison comprises:

a determination of a difference between said determined number of clock cycles during said length of said transmitted symbol and said expected number of clock cycles during said transmitted symbol.

27. The method to frequency track a local oscillator of a first wireless device with a clock signal of a second wireless device according to claim 25, wherein said comparison comprises:

a determination of a ratio between said determined number of clock cycles during said length of said transmitted symbol and said expected number of clock cycles during said transmitted symbol.

28. The method to frequency track a local oscillator of a first wireless device with a clock signal of a second wireless device according to claim 25, further comprising:

computing a frequency offset of said local oscillator based on said comparison.

29. An apparatus to frequency track a local oscillator of a first wireless device with a clock signal of a second wireless device, comprising:

a local oscillator located within said first wireless device; and a controller running a software module adapted to adjust a frequency of said local oscillator only when a comparison of a number of clock cycles between boundaries of a received symbol differ by more than a predetermined threshold from an expected number of clock cycles, said predetermined threshold being non-zero and said received symbol comprising link verification data.

30. The apparatus to frequency track a local oscillator of a first wireless device with a clock signal of a second wireless device according to claim 29, wherein:

said difference is determined using a ratio between said number of clock cycles between boundaries of said received symbol and said expected number of clock cycles.

31. The apparatus to frequency track a local oscillator of a first wireless device with a clock signal of a second wireless device according to claim 29, wherein:

said difference is determined by performing subtraction between said number of clock cycles between boundaries of said received symbol and said expected number of clock cycles.

32. Apparatus for frequency tracking a local oscillator of a first wireless device with a clock signal of a second wireless device, comprising:

means for determining a number of clock cycles during a length of a data symbol transmitted from said first wireless device to said second wireless device, said data symbol comprising link verification data;

means for comparing said determined number of clock cycles during said length of said transmitted symbol to an expected number of clock cycles during said transmitted symbol; and means for adjusting a frequency of said local oscillator based on said comparison.

33. The apparatus for frequency tracking a local oscillator of a first wireless device with a clock signal of a second wireless device according to claim 32, wherein said means for comparing comprises:

means for determining a difference between said determined number of clock cycles during said length of said transmitted symbol and said expected number of clock cycles during said transmitted symbol.

34. The apparatus for frequency tracking a local oscillator of a first wireless device with a clock signal of a second wireless device according to claim 32, wherein said means for comparing comprises:

means for determining a ratio between said determined number of clock cycles during said length of said transmitted symbol and said expected number of clock cycles during said transmitted symbol.

* * * * *